(12) United States Patent
Takahashi

(10) Patent No.: US 11,600,874 B2
(45) Date of Patent: Mar. 7, 2023

(54) ELECTRICAL EQUIPMENT BATTERY FOR VEHICLES

(71) Applicant: SANYO Electric Co., Ltd., Daito (JP)

(72) Inventor: Hiroyuki Takahashi, Hyogo (JP)

(73) Assignee: SANYO Electric Co., Ltd., Daito (JP)

(*) Notice: Subject to any disclaimer, the term of this patent is extended or adjusted under 35 U.S.C. 154(b) by 738 days.

(21) Appl. No.: 16/467,835

(22) PCT Filed: Nov. 22, 2017

(86) PCT No.: PCT/JP2017/041977
§ 371 (c)(1),
(2) Date: Jun. 7, 2019

(87) PCT Pub. No.: WO2018/110232
PCT Pub. Date: Jun. 21, 2018

(65) Prior Publication Data
US 2021/0367292 A1 Nov. 25, 2021

(30) Foreign Application Priority Data

Dec. 16, 2016 (JP) .............................. JP2016-244831

(51) Int. Cl.
*H01M 10/667* (2014.01)
*H05K 1/02* (2006.01)
(Continued)

(52) U.S. Cl.
CPC .......... *H01M 10/667* (2015.04); *B60R 16/04* (2013.01); *H01M 10/615* (2015.04);
(Continued)

(58) Field of Classification Search
None
See application file for complete search history.

(56) References Cited

U.S. PATENT DOCUMENTS

2002/0079119 A1* 6/2002 Takata ................. H05K 5/0095
174/544
2006/0185836 A1* 8/2006 Garner ................... H01L 23/36
165/185
(Continued)

FOREIGN PATENT DOCUMENTS

CN 102725881 A 10/2012
JP 2003-031978 A 1/2003
(Continued)

OTHER PUBLICATIONS

English Translation of Search Report dated Oct. 11, 2021, issued in counterpart CN Application No. 201780076506.2.

*Primary Examiner* — Ula C Ruddock
*Assistant Examiner* — Mary Grace Byram
(74) *Attorney, Agent, or Firm* — WHDA, LLP

(57) ABSTRACT

The electrical equipment battery includes: a circuit board mounted with a heat generating element; and an outer case having a heat radiation plate made of metal. A heat transfer space is defined between the circuit board and the heat radiation plate, and then an electrical-insulating and heat-conducting gel is filled in the heat transfer space. Heat energy of the heat generating element is radiated to the outside via the heat radiation plate of the outer case. The heat radiation plate is provided with a flow-out block partition on the outer side of the heat transfer space. The flow-out block partition suppresses the electrical-insulating and heat-conducting gel from flowing out from the heat transfer space.

6 Claims, 7 Drawing Sheets

(51) Int. Cl.

| | | |
|---|---|---|
| *H01M 10/615* | (2014.01) | |
| *H01M 10/625* | (2014.01) | |
| *H01M 10/653* | (2014.01) | |
| *H01M 10/6551* | (2014.01) | |
| *H01M 10/6554* | (2014.01) | |
| *H01M 50/249* | (2021.01) | |
| *H01M 50/284* | (2021.01) | |
| *B60R 16/04* | (2006.01) | |
| *H01M 50/213* | (2021.01) | |
| *H01M 50/224* | (2021.01) | |
| *H01M 50/227* | (2021.01) | |
| *H01M 10/42* | (2006.01) | |
| *H01M 10/658* | (2014.01) | |

(52) U.S. Cl.
CPC ....... *H01M 10/625* (2015.04); *H01M 10/653* (2015.04); *H01M 10/6551* (2015.04); *H01M 10/6554* (2015.04); *H01M 50/213* (2021.01); *H01M 50/224* (2021.01); *H01M 50/227* (2021.01); *H01M 50/249* (2021.01); *H01M 50/284* (2021.01); *H05K 1/0203* (2013.01); *H01M 10/425* (2013.01); *H01M 10/658* (2015.04); *H01M 2220/20* (2013.01); *H05K 2201/066* (2013.01); *H05K 2201/0999* (2013.01); *H05K 2201/10037* (2013.01)

(56) References Cited

U.S. PATENT DOCUMENTS

| | | | |
|---|---|---|---|
| 2008/0292950 A1* | 11/2008 | Maeda | H01M 50/209 429/120 |
| 2012/0308848 A1 | 12/2012 | Miyamae et al. | |
| 2013/0122341 A1* | 5/2013 | De Paoli | H01M 50/213 429/99 |
| 2016/0009194 A1* | 1/2016 | Katayama | H01M 10/482 320/109 |
| 2016/0295745 A1* | 10/2016 | Nishimoto | H05K 7/20845 |

FOREIGN PATENT DOCUMENTS

| | | |
|---|---|---|
| JP | 2005-317456 A | 11/2005 |
| JP | 2008-143432 A | 6/2008 |
| JP | 2016-152349 A | 8/2016 |
| JP | 2016-197688 A | 11/2016 |

* cited by examiner

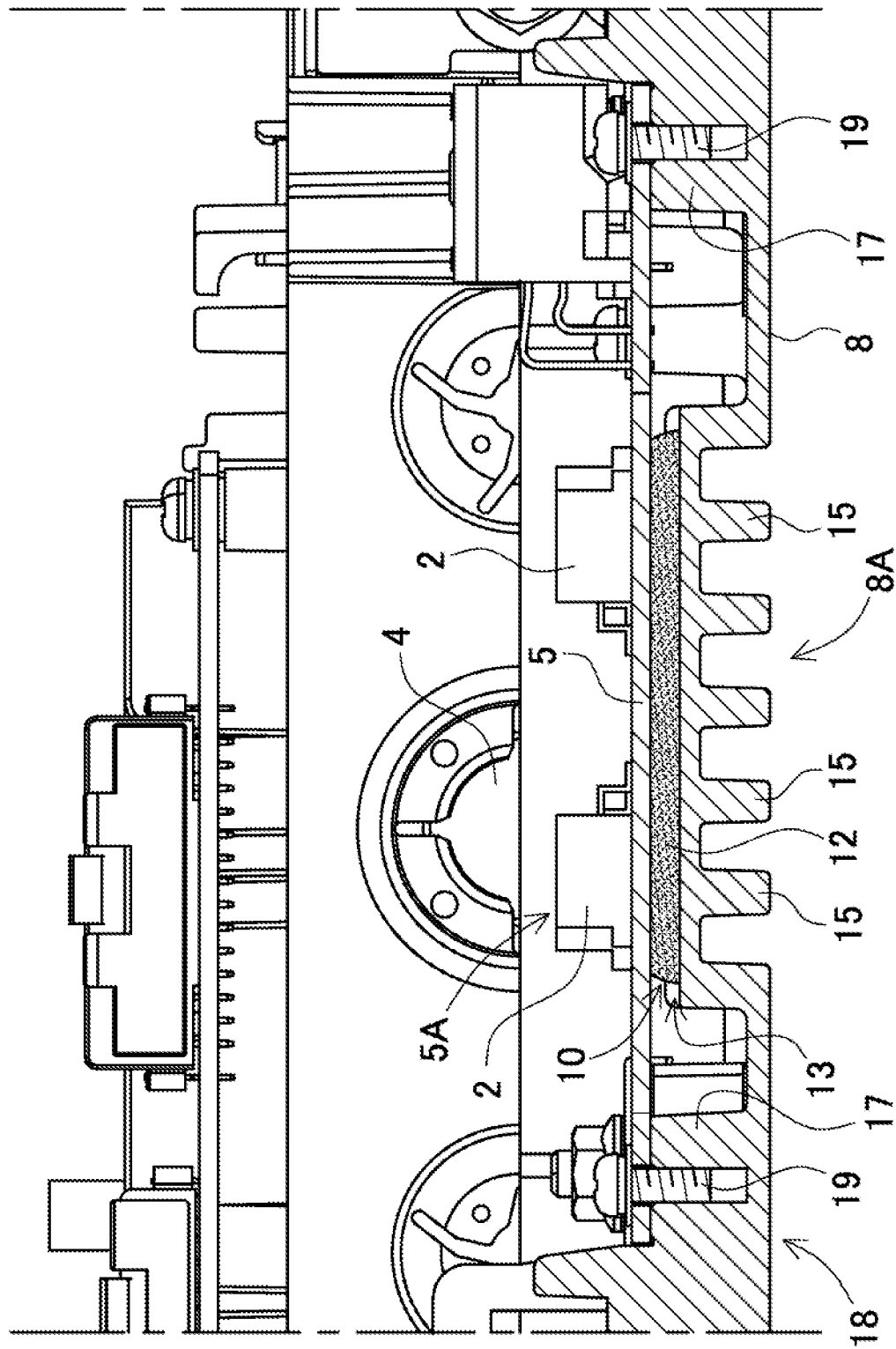

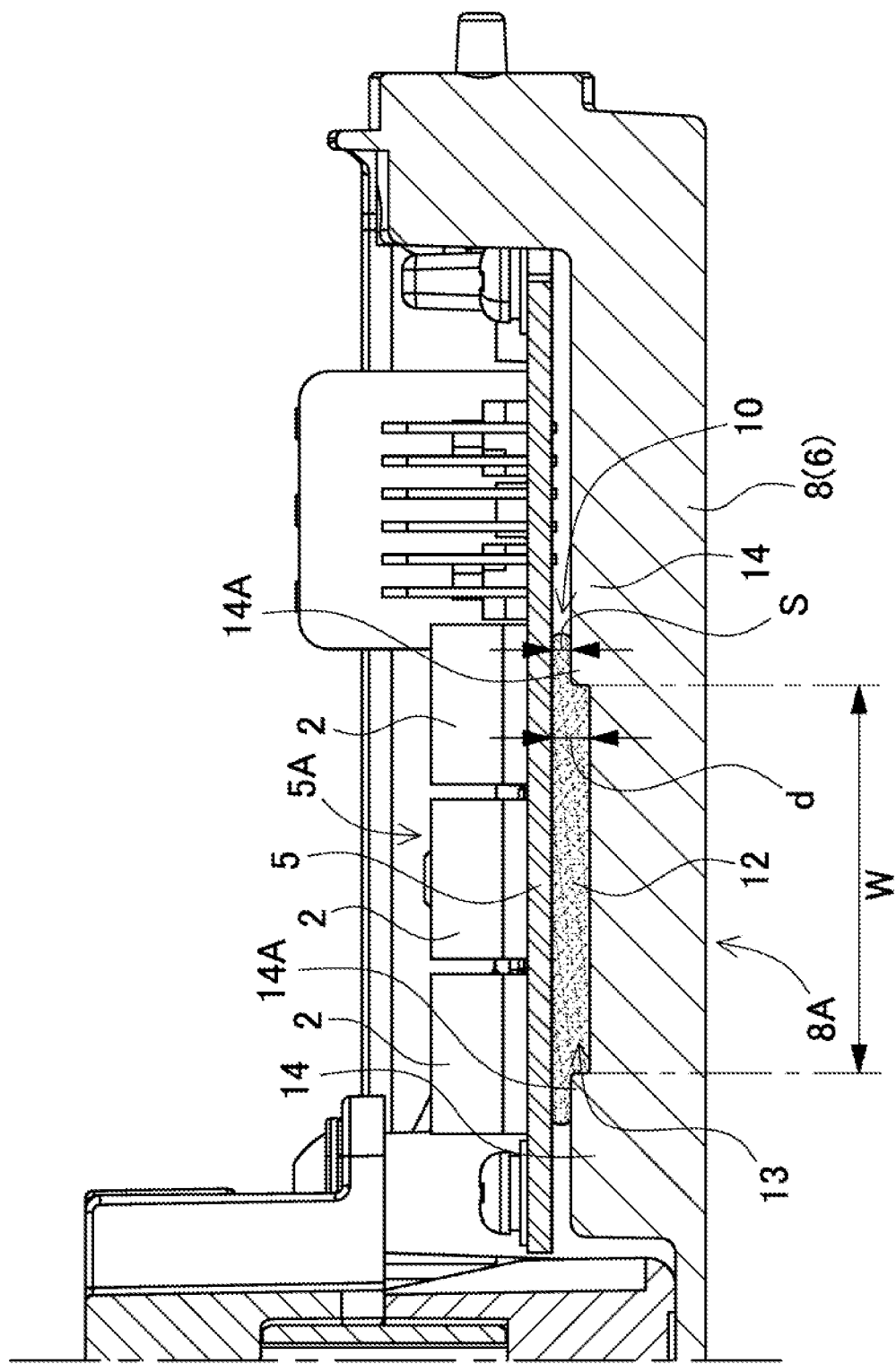

ELECTRICAL EQUIPMENT BATTERY FOR VEHICLES

TECHNICAL FIELD

The present invention relates mainly to an electrical equipment battery for vehicles, which is used connected in parallel to a lead battery that supplies electric power to electric devices mounted in a vehicle.

BACKGROUND ART

Vehicles are equipped with a lead battery, as an equipment battery, that supplies electric power to electric devices. The lead battery supplies the electric power to all electric devices in a vehicle and also supplies the electric power to all components required for the vehicle to travel; examples of such components include a cell motor, an engine control circuit, an electric power steering motor, automatic control, and by-wiring components such as a brake and a steering. On the other hand, in order to improve their fuel consumption, some modern vehicles employ a system in which a lead battery is charged with regeneration electric power generated during idling stop or speed reduction.

The lead battery continuously supplies the electric power to some electric components even while the ignition switch is off. Also, the lead battery self-discharges. As a result, the remaining capacity of the lead battery decreases. Nevertheless, even when the voltage decreases with the discharging, the lead battery does not stop supplying the electric power to the electric devices. If the vehicle is not used for a long period, the lead battery is not charged for a long period, in which case the lead battery may be completely discharged. When completely discharged, the lead battery cannot drive the cell motor to start up the engine. This disadvantage can be addressed by connecting an electrical equipment battery in parallel to the lead battery; the electrical equipment battery being a secondary battery, such as a nickel hydride battery or a lithium ion battery, different from the lead battery.

Electrical equipment batteries, such as nickel hydride or lithium ion batteries, are superior in charge efficiency and self-discharge rate to lead batteries. Thus, even if an electrical equipment battery is not used for a long period, the remaining capacity is not decreased so rapidly. Furthermore, a power switch can be provided between a lead battery and an electrical equipment battery used by being connected in parallel to the lead battery. When the ignition switch is off, the power switch disconnects the electrical equipment battery from the lead battery. If the power switch in the electrical equipment battery is off, the secondary battery does not discharge even while the vehicle is not used for a long period. For this reason, if the lead battery fails to drive the cell motor, the power switch can be turned on to cause the electrical equipment battery to drive the cell motor to start up the engine. Moreover, while the vehicle is traveling, the power switch can be switched on to connect the electrical equipment battery in parallel to the lead battery so that the electric power is supplied stably to all apparatuses in the vehicle. To realize these operations, the power switch that is provided at the output of the electrical equipment battery connected in parallel to the lead battery connects the lead battery to a nickel hydride battery or a lithium ion battery as necessary.

The power switch may be either a relay or a semiconductor switching element that withstands a large current. The relay that performs a switching operation at a given node may fail to operate due to a contact failure of this node, and may disadvantageously emit noise in response to the switching operation. The semiconductor switching element provides excellent advantages, such as high reliability and a long lifetime but may act as a heat generating element that generates heat due to Joule heat of current, causing a temperature rise. It is thus necessary to radiate the heat efficiently. This is because the temperature rise may hinder a stable operation of the heat generating element itself and overheat surrounding components, including the secondary battery, thereby leading to various troubles. The degree to which temperature of the heat generating element, such as the semiconductor switching element, increases depends on the balance of the amounts of generated heat and radiated heat. How efficiently the heat is radiated can be an important factor in stable operations of the heat generating element itself and surrounding components.

To radiate heat from the semiconductor switching element as the heat generating element, the following structure is employed: a semiconductor element is fixed to and thermally coupled to an inner surface of a metal case, which is made of aluminum and used as an outer case, and an insulating material, such as mica or a plastic sheet, and a heat-conducting paste are interposed between the semiconductor element and the metal case. In this structure, however, when a circuit board on which the semiconductor switching element as the heat generating element is mounted is fixed to the metal case, the relative position between the circuit board and the semiconductor switching element is determined. It is therefore difficult to simultaneously fix the circuit board to the metal case and the semiconductor switching element to the circuit board. To avoid this inconvenience, the semiconductor switching element may be connected to the circuit board via a lead wire after being fixed to the metal case. This assembling process, however, may be complicated. This inconvenience can be overcome by employing the following structure: the semiconductor switching element is fixed to the circuit board without being fixed to the metal case, and a heat radiation fin is fixed to the semiconductor switching element so that heat is radiated from the semiconductor switching element. This heat radiation structure, however, may disadvantageously cause a temperature rise inside the outer case, because the heat radiation fin dissipates heat inside the outer case. The temperature rise can be addressed by employing a structure for ventilating the outer case. It may be, however, difficult to freely ventilate the outer case of the electrical equipment battery for vehicles. This is because a structure that blocks entry of external liquid under various usage conditions is demanded for the electrical equipment battery for vehicles.

Another structure for radiating heat from the heat generating element has been developed. In this structure, heat energy of the heat generating element is transmitted to a heat radiating part remotely positioned (See PTL 1).

More specifically, the heat generating element is thermally coupled to the heat radiating part via a heat pipe, which transfers the heat from the heat generating element to the heat radiating part. This heat radiating structure enables the heat generating element to be positioned at a distance from the heat radiating part. However, the heat radiating structure may involve high component cost, because the heat pipe is used to transfer the heat. In addition, it may be difficult to thermally couple both ends of the heat pipe under an ideal condition. More specifically, it may be difficult to hold both ends of the heat pipe in an ideal thermally coupling state under a long-time vibrating usage condition, such as a condition inside a vehicle. The heat pipe conducts heat efficiently, but if the heat pipe is not ideally thermally coupled to the heat radiating part due to thermal resistance, the heat cannot be radiated from the heat generating element efficiently.

CITATION LIST

Patent Literature

PTL 1: Unexamined Japanese Patent Publication No. 2008-143432

SUMMARY OF THE INVENTION

For the purpose of overcoming conventional disadvantages as described above, the inventor of the present invention and others have conceived of a structure in which a semiconductor switching element as a heat generating element is fixed to a circuit board, the circuit board is disposed adjacent to an outer case made of metal, and an electrical-insulating and heat-conducting gel is interposed between the circuit board and the outer case. This structure successfully addresses these disadvantages. The structure in which the semiconductor switching element as the heat generating element is mounted on the circuit board improves assembling efficiency. In addition, heat of the circuit board is transferred to the metal case via the electrical-insulating and heat-conducting gel without being radiated inside the outer case and then radiated to an outside of the outer case. In this way, the temperature rise inside the outer case can be suppressed. Like a heat-conducting paste filled in a gap between mutually contact surfaces, the electrical-insulating and heat-conducting gel is filled in a gap, which is not small but considerably large, to make contact with both the surfaces of the circuit board and the metal case, so that heat energy is transferred efficiently via the electrical-insulating and heat-conducting gel. As a result, even if the gap between the circuit board and the metal case is set to as large as several millimeters, the heat can be transferred efficiently from the circuit board to the metal case. Furthermore, the electrical-insulating and heat-conducting gel, which conducts heat but does not conduct electricity, is filled in the gap between the circuit board and the metal case so that heat is transferred efficiently from the circuit board to the metal case. Using this electrical-insulating and heat-conducting gel does not involve any extra insulating process using an insulating sheet, for example, as opposed to using a heat-conducting paste. In short, the above heat radiating structure efficiently takes advantage of excellent properties of the electrical-insulating and heat-conducting gel and can transfer heat efficiently and stably from the circuit board to the metal case with a simple assembling process. However, the electrical-insulating and heat-conducting gel has a physical property in which the viscosity is lowered by stress. If the electrical-insulating and heat-conducting gel is filled in a large gap in a vehicle and undergoes vibration, the viscosity may be lowered and the electrical-insulating and heat-conducting gel may flow out from the gap, gradually degrading the heat transfer property between the circuit board and the metal case with time.

The present invention has been accomplished to solve disadvantages as described above. An important object of the present invention is to provide an electrical equipment battery for vehicles that can reliably suppress various troubles resulting from overheating of a heat generating element. The electrical equipment battery has a structure in which a semiconductor switching element as the heat generating element is mounted on a circuit board. This structure can be assembled efficiently. Heat energy of the heat generating element is radiated efficiently to an outside of the outer case. As a result, even when mounted in a vehicle and undergoing vibration, the electrical equipment battery radiates heat of the heat generating element efficiently to the outside of the outer case over a long period.

An electrical equipment battery for vehicles of the present invention includes: a secondary battery; a circuit board mounted with a protection circuit for the secondary battery and a heat generating element; and an outer case that accommodates the circuit board and the secondary battery. The outer case has a heat radiation plate made of metal. The heat radiation plate is provided with a heat transfer space defined between the heat radiation plate and a heat generating element mounting part of the circuit board. An electrical-insulating and heat-conducting gel, having viscosity that is lowered by stress, is filled in the heat transfer space. Heat generated by the heat generating element mounting part is transferred to the heat radiation plate via the electrical-insulating and heat-conducting gel. The heat radiation plate has a flow-out block partition on an outer side of the heat transfer space. The flow-out block partition is configured to suppress the electrical-insulating and heat-conducting gel filled in the heat transfer space from flowing out from the heat transfer space.

In the electrical equipment battery for vehicles of the present invention, electronic components including the heat generating element are mounted on a front surface of the circuit board, and a rear surface of the circuit board is thermally coupled to the heat radiation plate via the electrical-insulating and heat-conducting gel.

In the electrical equipment battery for vehicles of the present invention, a gap of the heat transfer space is set to less than or equal to 3 mm.

In the electrical equipment battery for vehicles of the present invention, a heat radiation fin is provided on an outer side of the heat radiation plate.

In the electrical equipment battery for vehicles of the present invention, the outer case includes a metal case and a plastic case. The metal case includes the heat radiation plate. The plastic case covers an opening of the metal case.

In the electrical equipment battery for vehicles of the present invention, the heat generating element is a semiconductor switching element that connects the secondary battery to a lead battery mounted in a vehicle.

An electrical equipment battery of the present invention can reliably suppress various troubles resulting from overheating of a heat generating element. The electrical equipment battery has a structure in which a semiconductor switching element as the heat generating element and other elements are mounted on a circuit board. This structure can be assembled efficiently. Heat energy of the heat generating element is radiated efficiently to an outside of the outer case. As a result, even when mounted in a vehicle and undergoing vibration, the electrical equipment battery radiates heat of the heat generating element efficiently to the outside of the outer case over a long period.

The above electrical equipment battery, which can be assembled efficiently, radiates heat energy efficiently from the heat generating element to the outside of the outer case. A reason why this structure can reliably suppress various troubles resulting from overheating of the heat generating element is as follows. The heat generating element is mounted on the circuit board. The outer case has a heat radiation plate made of metal. The heat radiation plate is provided with a heat transfer space defined between the heat radiation plate and the circuit board. An electrical-insulating and heat-conducting gel is filled in the heat transfer space. Heat generated by the heat generating element is transferred to the heat radiation plate via the electrical-insulating and heat-conducting gel and radiated to the outside of the outer case. Moreover, the heat transfer space, having viscosity that is lowered by stress, is filled in the heat transfer space. The heat energy of the heat generating element is efficiently transmitted to the outer case and radiated from the outer case. When mounted in a vehicle, the electrical equipment battery can efficiently radiate heat generated by the heat generating element to the outside over a long period. A reason for this is that the heat radiation plate is provided with a flow-out block partition on an outer side of the heat transfer space. This flow-out block partition is configured to suppress the electrical-insulating and heat-conducting gel from flowing out even if the viscosity is lowered.

BRIEF DESCRIPTION OF DRAWINGS

FIG. 6 is a cross-sectional view of a part taken along line VI-VI in FIG. 5.

FIG. 7 is a cross-sectional view of a part taken along line VII-VII in FIG. 5.

DESCRIPTION OF EMBODIMENT

Figure 1:
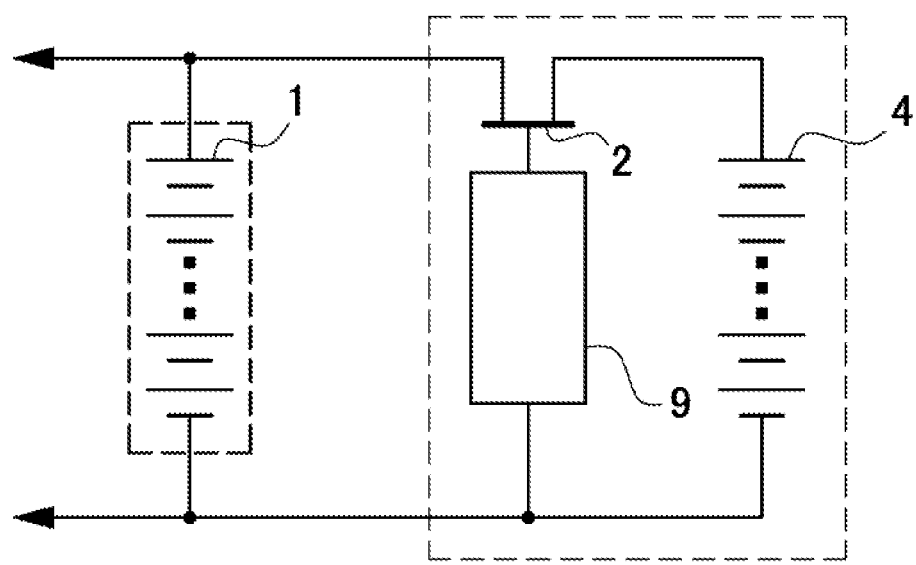
FIG. 1 is a circuit diagram illustrating a usage condition of an electrical equipment battery for vehicles of the present invention.

An exemplary embodiment of the present invention will be described below with reference to the accompanying drawings. The exemplary embodiment described below illustrates an electrical equipment battery for vehicles which embody technical ideas of the present invention. The electrical equipment battery for vehicles of the present invention is, however, not limited to a battery having a structure and made of a material described below.

Herein, in order to help understanding of the scope of the claims, the reference numerals corresponding to members in the exemplary embodiment are assigned to members in the "claims" and in the "section of solution to problem". It should be noted that, however, the members in the claims are not necessarily limited to the members in the exemplary embodiment.

As illustrated in the circuit diagram of FIG. 1, an electrical equipment battery for vehicles is used by being connected in parallel to lead battery 1 mounted in a vehicle. The electrical equipment battery in FIG. 1 includes a semiconductor switching element as heat generating element 2. The semiconductor switching element as heat generating element 2 is a power switch, which connects secondary batteries 4, being of a built-in type, in parallel to lead battery 1. While an ignition switch (not illustrated) is on, namely, while a vehicle is traveling, the semiconductor switching element is switched on. However, even while the ignition switch is off, the semiconductor switching element can be switched on at a necessary timing to supply electric power to or from the lead battery. The electrical equipment battery, in which the semiconductor switching element is switched on when the ignition switch is off, calculates a remaining capacity of secondary batteries 4. Then, if the remaining capacity becomes lower than a minimum capacity, the semiconductor switching element can be switched off to stop discharging of the secondary batteries.

The electrical equipment battery for vehicles of the present invention is mainly used by being connected in parallel to the lead battery. However, the electrical equipment battery is not necessarily used by being connected in parallel to the lead battery if the secondary batteries have a large capacity. Even if the electrical equipment battery of the present invention is not connected in parallel to the lead battery but used alone as a power source for all electric devices, the semiconductor switching element as the heat generating element may be connected to an output of the secondary batteries. This semiconductor switching element is switched off to stop the supply of the electric power to all the electric devices in the vehicle when the remaining capacity of the secondary batteries becomes lower than the minimum capacity. In this way, the remaining capacity is suppressed from decreasing. The minimum capacity, which triggers the semiconductor switching element to be switched off, may be set to a remaining capacity that is high enough for the secondary batteries to be able to drive the cell motor to start up the engine. The secondary batteries with this minimum capacity can start up the engine, allowing the vehicle to travel even if the vehicle is not used for a long period. If the vehicle is a hybrid or electric-powered vehicle having a high-voltage battery that can charge secondary batteries, the minimum capacity, which triggers the semiconductor switching element to be switched off, may be set to the minimum capacity that enables the secondary batteries to activate a battery electronic control unit (ECU) or an engine ECU in the high-voltage battery.

Figure 3:
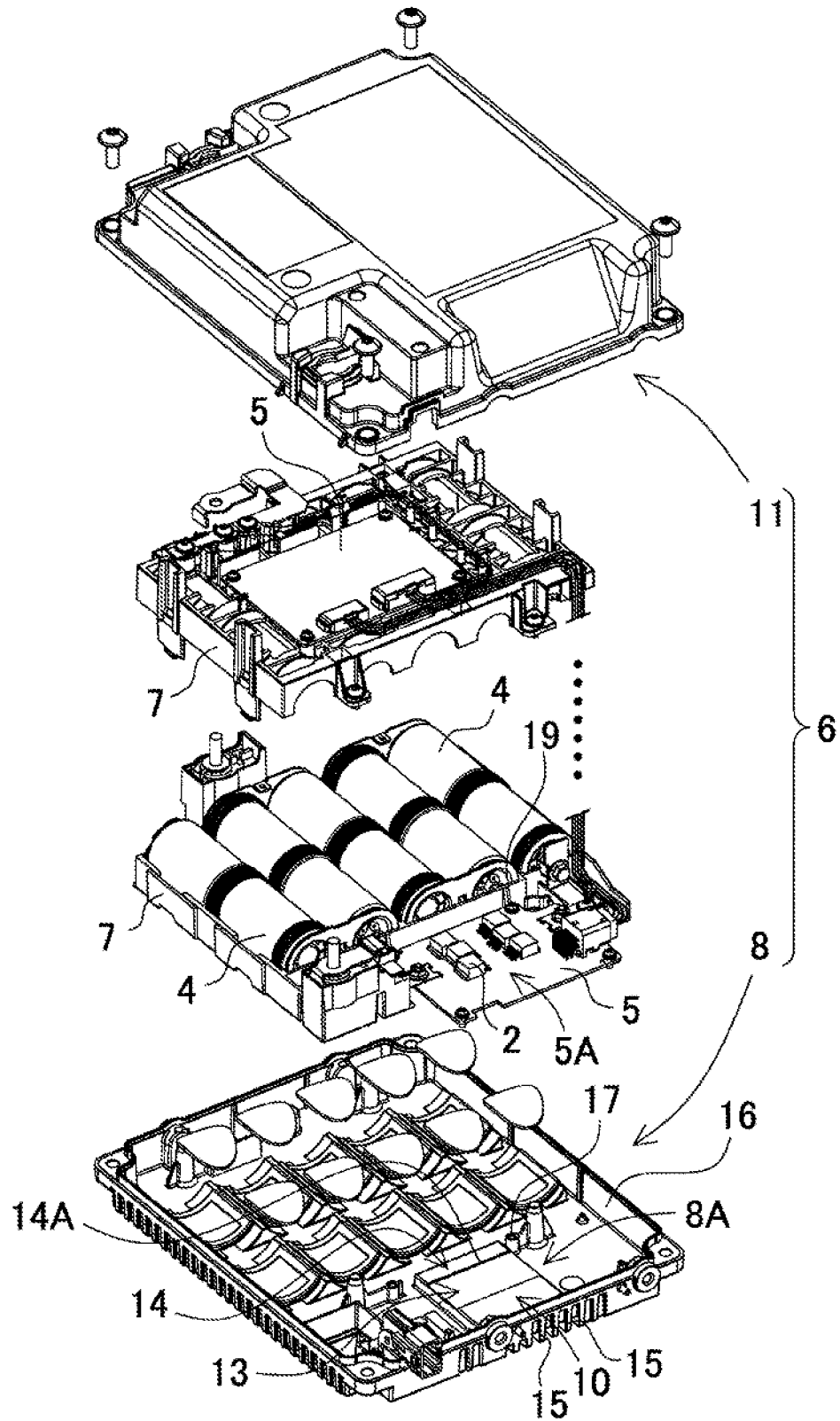
FIG. 3 is an exploded perspective view of the electrical equipment battery according to the exemplary embodiment of the present invention as viewed from above.
Figure 4:
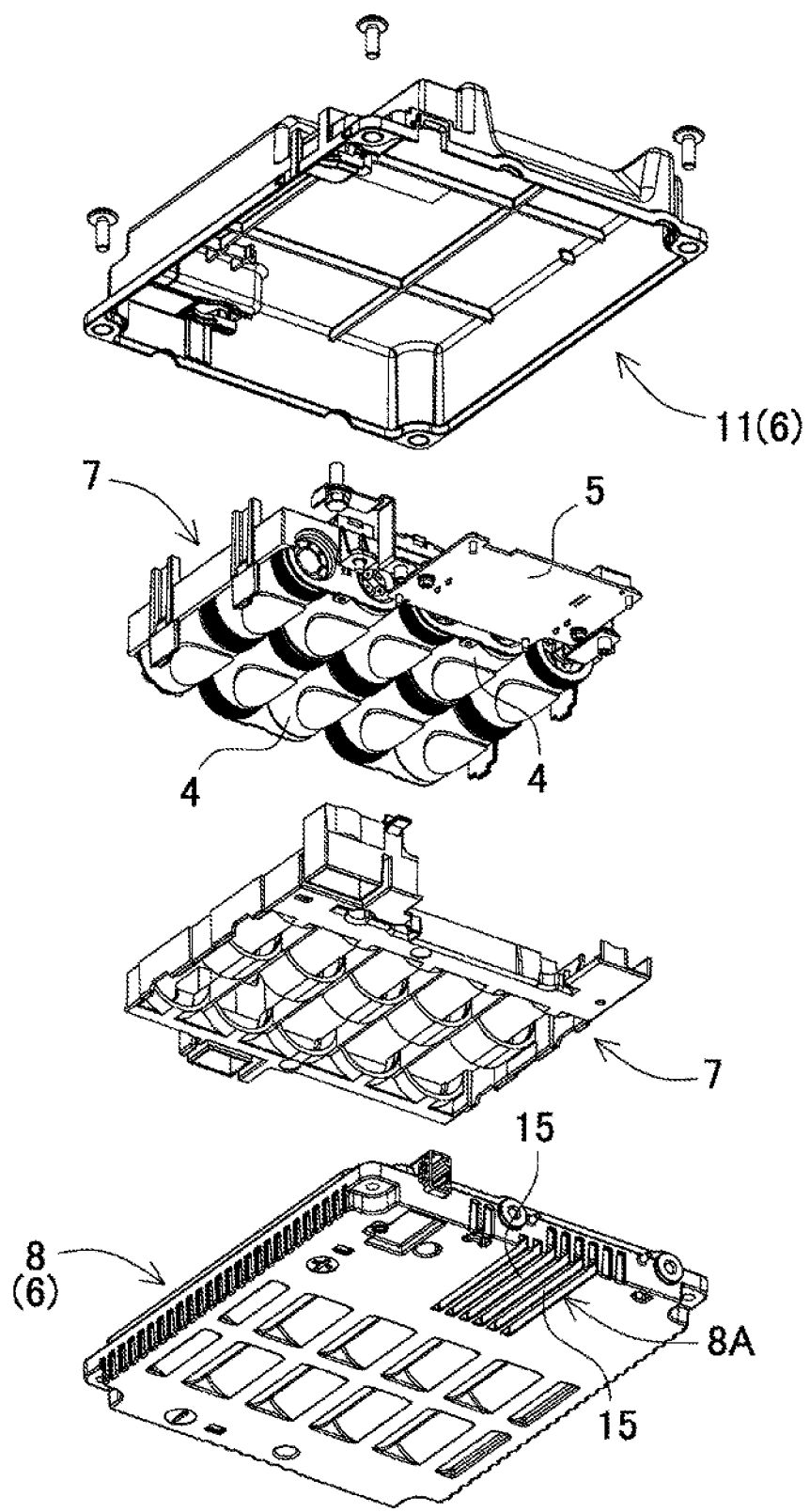
FIG. 4 is an exploded perspective view of the electrical equipment battery according to the exemplary embodiment of the present invention as viewed from below.
Figure 5:
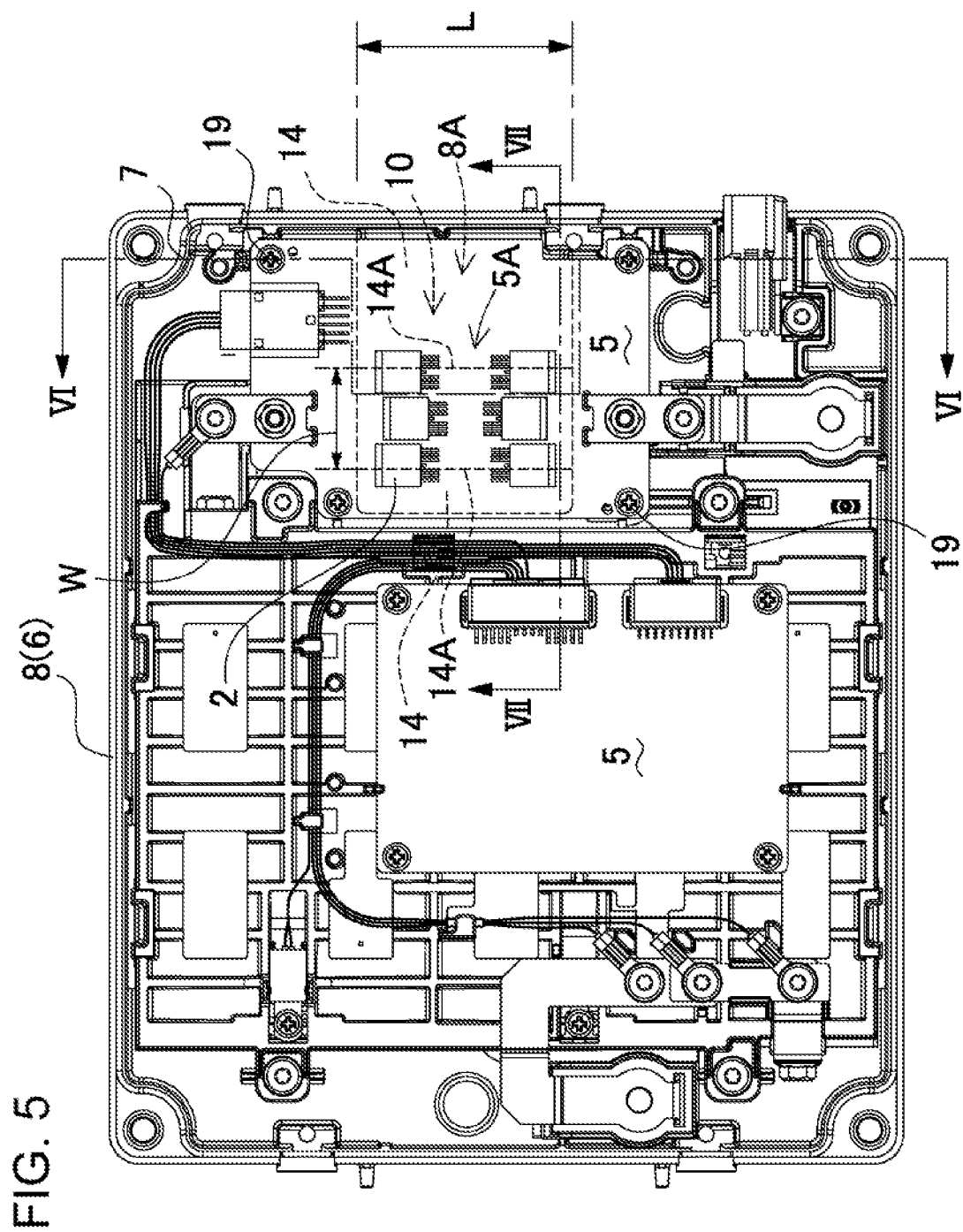
FIG. 5 is a plan view of a metal case of the electrical equipment battery according to the exemplary embodiment of the present invention.

As illustrated in the circuit diagram of FIG. 1, a schematic cross-sectional view of FIG. 2, an exploded perspective view as viewed from above in FIG. 3, an exploded perspective view as viewed from below in FIG. 4, a plan view of a metal case in FIG. 5, a cross-sectional view of FIG. 6 which is taken along line VI-VI in FIG. 5, and a cross-sectional view of FIG. 7 which is taken along line VII-VII in FIG. 5, the electrical equipment battery includes secondary batteries 4, the semiconductor switching element, circuit board 5, and outer case 6. The semiconductor switching element as heat generating element 2 is connected in series to secondary batteries 4. Circuit board 5 has electronic components including heat generating element 2 as a semiconductor power switch. Outer case 6 accommodates circuit board 5 and secondary battery 4.

Each secondary battery 4 may be a nickel hydride battery. However, each secondary battery 4 is not limited to a nickel hydride battery. Alternatively, each secondary battery 4 may be any other chargeable secondary battery, such as a lithium ion battery. More specifically, each secondary battery 4 may be any given secondary battery that has a larger charge or discharge capacity per weight and volume than a charge or discharge capacity per weight and volume of a lead battery and that self-discharges at a lower rate than a discharge rate of the lead battery. In the electrical equipment battery illustrated in the drawings, each secondary battery 4 is a nickel hydride battery, and ten secondary batteries 4 are disposed in place by battery holder 7. Ten secondary batteries 4 are connected in series so that their rated voltage becomes 12 V, which is equal to a rated voltage of the lead battery. Battery holder 7 in which secondary batteries 4 are disposed in a horizontal plane is packed in outer case 6. Battery holder 7 defines a circuit board space, which is a region in which circuit board 5 is disposed. Circuit board 5 is mounted in the circuit board space and fixed to outer case 6 in a horizontal position.

Although not illustrated, each secondary battery may be a lithium ion battery. If lithium ion batteries are used, three or four lithium ion batteries may be connected in series so that their output voltage becomes equal to the output voltage of the lead battery. Secondary batteries 4 preferably have an output capacity that is high enough to be able to drive the cell motor when the lead battery is completely discharged. In other words, secondary batteries 4 preferably have an output capacity that is high enough to be able to drive the cell motor only by itself. This electrical equipment battery thus can drive the cell motor to start up the engine, allowing the vehicle to travel, even when the lead battery is completely discharged.

Secondary batteries 4 are connected in parallel to the lead battery via the semiconductor switching element. Secondary batteries 4 and the lead battery are charged or discharged together. Secondary batteries 4 are directly connected in parallel to the lead battery via the semiconductor switching element as heat generating element 2. Alternatively, secondary batteries 4 may be connected to the lead battery via a voltage regulating inverter (not illustrated) that converts voltage. The voltage regulating inverter regulates a voltage across the secondary batteries and outputs this voltage to the lead battery or regulates a voltage across the lead battery and outputs this voltage to the secondary batteries. In short, the voltage regulating inverter regulates charge and discharge currents for each of the secondary batteries and the lead battery, which are connected in parallel, to respective optimum values. The voltage regulating inverter is preferably incorporated in the electrical equipment battery, and a control circuit in this electrical equipment battery controls a voltage. The voltage across the lithium ion battery varies in accordance with its remaining capacity. Therefore, by connecting the voltage regulating inverter between the lithium ion battery and the lead battery, it is possible to regulate the charge and discharge currents for each of the lithium ion battery and the lead battery to respective optimum values. If the lead battery fails to start up the engine when the heat generating element is switched on, the voltage regulating inverter causes the secondary batteries to charge the lead battery. Then, the charged lead battery can drive the cell motor to drive the engine. The electrical equipment battery that starts up the engine with this system does not have to drive the cell motor directly with the output of the voltage regulating inverter, and thus an output current of the voltage regulating inverter can be set to be smaller than a drive current of the cell motor. In addition to driving the cell motor mounted in the vehicle, the electrical equipment battery supplies the electric power to other apparatuses, such as a motor in an electric power steering. Therefore, the electrical equipment battery needs to have an output high enough to supply the electric power to all the apparatuses when connected in parallel to the lead battery.

The voltage regulating inverter includes: a semiconductor switching element, such as a power metal oxide semiconductor field effect transistor (MOSFET), an insulated gate bipolar transistor (IGBT), or a power transistor; and a semiconductor switching element, such as a large-current diode. Each of these semiconductor switching elements serves as a heat generating element that generates heat due to Joule heat of large current. The semiconductor switching elements each serving as the heat generating element are mounted on the circuit board. The heat energy generated by each semiconductor switching element is thermally transmitted to the metal case of the outer case and radiated to the outside, so that the maximum temperature is kept lower than the maximum rated temperature.

Secondary batteries 4 connected in parallel to lead battery 1 are charged by a power generator mounted in the vehicle. Alternatively, if the vehicle is a hybrid or electric vehicle, a voltage across a high-voltage battery used for driving a motor for traveling may be stepped down by a direct-current and direct-current (DC-DC) converter, and the secondary batteries 4 may be charged with this step-down voltage. In order to provide high fuel efficiencies, contemporary vehicles have a lead battery and a secondary battery that can be charged with regeneration electric power, which is generated during regenerative braking. Using the regeneration electric power can charge both the secondary battery and the lead battery with large current in a very short time. The secondary battery can be charged with the regeneration electric power more efficiently than the lead battery. In other words, the secondary battery can be charged with the regeneration electric power at a higher rate. For example, if the vehicle that travels at a certain speed stops in 10 seconds or less, the vehicle generates several tens of watt per hour of regeneration electric power, which enables the secondary battery to be charged with a large current exceeding 100 A. The large current equal to or more than 100 A generates heat in the semiconductor switching element as the heat generating element. The amount of heat generated in the semiconductor switching element increases in proportion to the square of the current. Thus, the regeneration electric power generates an extremely large amount of heat in the semiconductor switching element. As a result, the temperature of the semiconductor switching element increases rapidly. In contemporary vehicles, some electric components, such as an electric power steering, also consume large currents during the traveling, in addition to during the regenerative braking. As described above, the semiconductor switching element as the heat generating element generates a large amount of heat due to Joule heat. For this reason, it is extremely important to radiate the heat efficiently from the semiconductor switching element in order to reduce its temperature rise.

The semiconductor switching element as heat generating element 2 may be a power MOSFET having a large maximum rated current. Instead of the power MOSFET, alternatively, the semiconductor switching element may also be any other semiconductor switching element having a large maximum rated current, such as an IGBT or a power transistor. Control circuit 9 controls on/off of the semiconductor switching element as heat generating element 2, so as to connect secondary batteries 4 to the lead battery. When the ignition switch is on, control circuit 9 switches on the semiconductor switching element to connect secondary batteries 4 to lead battery 1. Likewise, when the ignition switch is off, control circuit 9 can switch on the semiconductor switching element at a necessary timing, thereby connecting secondary batteries 4 to lead battery 1.

A protection circuit for secondary batteries 4 and heat generating element 2 are mounted on circuit board 5. Heat generating element 2 is a semiconductor switching element that feeds a large current, thereby generating heat. This semiconductor switching element is a semiconductor element, such as a power MOSFET, which connects secondary batteries 4 to the lead battery. The semiconductor switching element, such as a power MOSFET, serving as the heat generating element, is mounted on the circuit board also in the voltage regulating inverter. All the electronic components are mounted on an upper surface of circuit board 5 in the figures. These electronic components have lead wires that protrude from a lower surface of circuit board 5, forming conductive projections.

As illustrated in FIGS. 2 to 7, the electrical equipment battery defines heat transfer space 10 between outer case 6 and the rear surface of circuit board 5 which is opposite to the upper surface on which heat generating element 2 is mounted. Furthermore, circuit board 5 is fixed to outer case 6. Circuit board 5 in the figures is fixed at its four corners to a bottom of outer case 6 with screws. Circuit board 5 is fixed to outer case 6 with heat transfer space 10 between circuit board 5 and outer case 6, so that conductive parts of circuit board 5 which protrude from the rear surface do not make contact with outer case 6. Circuit board 5 is disposed while maintaining an attitude parallel to the counter surface of outer case 6, with heat transfer space 10 keeping a predetermined gap between circuit board 5 and outer case 6. By making heat transfer space 10 smaller, the heat transfer property can be improved. However, by making heat transfer space 10 excessively small, the conductive parts of circuit board 5 may make contact with outer case 6. For this reason, as an example, a clearance (d) of heat transfer space 10 is preferably set to more than 0.5 mm, preferably more than 1 mm. If heat transfer space 10 is excessively large, the heat transfer property of transferring heat from circuit board 5 to outer case 6 is lowered. In addition, an electrical-insulating and heat-conducting gel filled in heat transfer space 10 may flow easily. For this reason, the clearance of heat transfer space 10 is preferably set to less than 3 mm.

Outer case 6 includes metal case 8 and plastic case 11. Plastic case 11 closes an opening of metal case 8. In outer case 6 in the figures, metal case 8 corresponds to a bottom case, whereas plastic case 11 corresponds to an upper case. Metal case 8, which is made of diecasting aluminum, has peripheral wall 16 surrounding bottom plate 18. Bottom plate 18 includes: heat radiation plate 8A partly protruding inwardly; and fitted parts into which battery holder 7 is to be fitted at a predetermined location. In addition, bottom plate 18 includes a plurality of bosses, as fixed parts 17, to which circuit board 5 is to be fixed. In metal case 8 in the figures, bottom plate 18 has four fixed parts 17 to which corresponding corners of circuit board 5 are to be fixed with screws. In bottom plate 18, heat radiation plate 8A is disposed on an inner side of four fixed parts 17. The four corners of circuit board 5 are fixed to fixed parts 17 of bottom plate 18 with screws. Heat radiation plate 8A is disposed opposite circuit board 5. Heat transfer space 10 with the predetermined clearance is defined between heat radiation plate 8A and circuit board 5. Individual fixed parts 17 are provided so as to protrude from the front surface of bottom plate 18, and screws 19 penetrate circuit board 5 and are inserted into fixed parts 17. In this way, circuit board 5 is fixed to bottom plate 18. Upper ends of fixed parts 17 are disposed on the same level. When circuit board 5 is fixed to these upper ends with screws 19, heat transfer space 10 of a predetermined gap is defined between circuit board 5 and heat radiation plate 8A. A height of fixed parts 17 specifies a height at which circuit board 5 is fixed. This structure can set the clearance of heat transfer space 10 to an optimum clearance by using the height of fixed parts 17. Moreover, metal case 8 is provided with the peripheral wall along an outer edge of the bottom surface. This peripheral wall has four through-holes at respective corners, to which plastic case 11 is to be fixed. Plastic case 11 has a peripheral wall that engages with the peripheral wall of metal case 8. Plastic case 11 is fixed to metal case 8 to enclose the internal structure, in which secondary batteries 4 and circuit board 5 are accommodated.

Heat radiation plate 8A of metal case 8 faces heat generating element mounting parts 5A of circuit board 5. Heat transfer space 10 is defined between heat radiation plate 8A and the rear surface of circuit board 5. Electrical-insulating and heat-conducting gel 12, having viscosity that is lowered by stress, is filled in heat transfer space 10. Electrical-insulating and heat-conducting gel 12 transmits heat energy from circuit board 5 to heat radiation plate 8A while electrically insulating circuit board 5 from heat radiation plate 8A. Electrical-insulating and heat-conducting gel 12 is flexibly deformed to make contact with both the rear surface of circuit board 5 and the front surface of heat radiation plate 8A without gaps therebetween. More specifically, electrical-insulating and heat-conducting gel 12 is applied to the surface of heat radiation plate 8A until a thickness of electrical-insulating and heat-conducting gel 12 becomes a predetermined value. Then, circuit board 5 is pressed against electrical-insulating and heat-conducting gel 12. In this way, electrical-insulating and heat-conducting gel 12 is in close contact with both the rear surface of circuit board 5 and the front surface of heat radiation plate 8A. Electrical-insulating and heat-conducting gel 12 transfers heat while keeping the electric insulation between circuit board 5 and heat radiation plate 8A. It is therefore unnecessary to subject the rear surface of circuit board 5 and the front surface of heat radiation plate 8A to any insulating process. Electrical-insulating and heat-conducting gel 12 is directly applied to the front surface of heat radiation plate 8A. Then, the rear surface of circuit board 5, which is not electrically insulated, is pressed against electrical-insulating and heat-conducting gel 12 until electrical-insulating and heat-conducting gel 12 makes close contact with both the rear surface of circuit board 5 and the front surface of heat radiation plate 8A. With this structure, heat is transferred efficiently from circuit board 5 to heat radiation plate 8A. In some cases, the rear surface of circuit board 5 may be coated with an insulating material before being brought into contact with electrical-insulating and heat-conducting gel 12. Since electrical-insulating and heat-conducting gel 12 electrically insulates circuit board 5 from heat radiation plate 8A and thermally couples circuit board 5 to heat radiation plate 8A, even when the coat of the insulating material on the rear surface of circuit board 5 is broken, electrical-insulating and heat-conducting gel 12 can transfer heat while keeping the electric insulation between circuit board 5 and heat radiation plate 8A.

The viscosity of electrical-insulating and heat-conducting gel 12 is lowered by stress. The electrical-insulating and heat-conducting gel used in this case may be formed by dispersing a heat-conducting powder (filler) such as aluminum oxide or zinc oxide into a binder such as oil. An electrical equipment battery mounted in a vehicle is inevitably affected by vibration. This is because outer case 6 is shaken when the engine vibrates or when the vehicle travels on a rough road surface. If electrical-insulating and heat-conducting gel 12, which is filled in heat transfer space 10 to transfer heat from circuit board 5 to heat radiation plate 8A, has its viscosity lowered by stress due to vibration, electrical-insulating and heat-conducting gel 12 may flow out from heat transfer space 10 between circuit board 5 and heat radiation plate 8A to the outside. In this case, electrical-insulating and heat-conducting gel 12 may fail to transfer heat efficiently from circuit board 5 to heat radiation plate 8A. Since the vehicle is used for a considerably long period such as 10 years or longer, a structure that can prevent electrical-insulating and heat-conducting gel 12 from flowing out from heat transfer space 10 over a long period is important. If electrical-insulating and heat-conducting gel 12 flows out from heat transfer space 10 to the outside, an air layer is generated between circuit board 5 and heat radiation plate 8A. This air layer may prominently lower a heat transfer property. As a result, temperature of heat generating element 2 may increase rapidly to cause various troubles that hinder a reliable, stable operation.

To avoid such troubles, as illustrated in the cross-sectional view of FIG. 7, flow-out block partitions 14 are provided in heat radiation plate 8A on the outer side of heat transfer space 10, and then electrical-insulating and heat-conducting gel 12 is filled in heat transfer space 10. As illustrated in the cross-sectional view of FIG. 7, flow-out block partitions 14 define flow block gap (S) opposite circuit board 5 and between projection surface 14A and circuit board 5. Flow block gap (S) is smaller than clearance (d) of the heat transfer space. Providing flow block gap (S) in this manner is effective in suppressing heat transfer space 10 from flowing out. By making flow block gap (S) smaller, flow-out block partitions 14 are more effective in suppressing electrical-insulating and heat-conducting gel from flowing out. However, by making flow block gap (S) excessively small, projection surface 14A may make contact with circuit board 5 to cause electrical short. For this reason, the clearance of flow block gap (S) may be set to more than 0.3 mm, preferably more than 0.5 mm.

A reason why the flow-out block partitions suppress the electrical-insulating and heat-conducting gel from flowing out from the heat transfer space is that electrical-insulating and heat-conducting gel cannot easily pass through flow block gap (S) having a small clearance provided opposite circuit board and also cannot easily flow out beyond the flow-out block partitions. It should be noted that the flow-out block partitions do not necessarily have to be provided opposite the circuit board.

Figure 2:
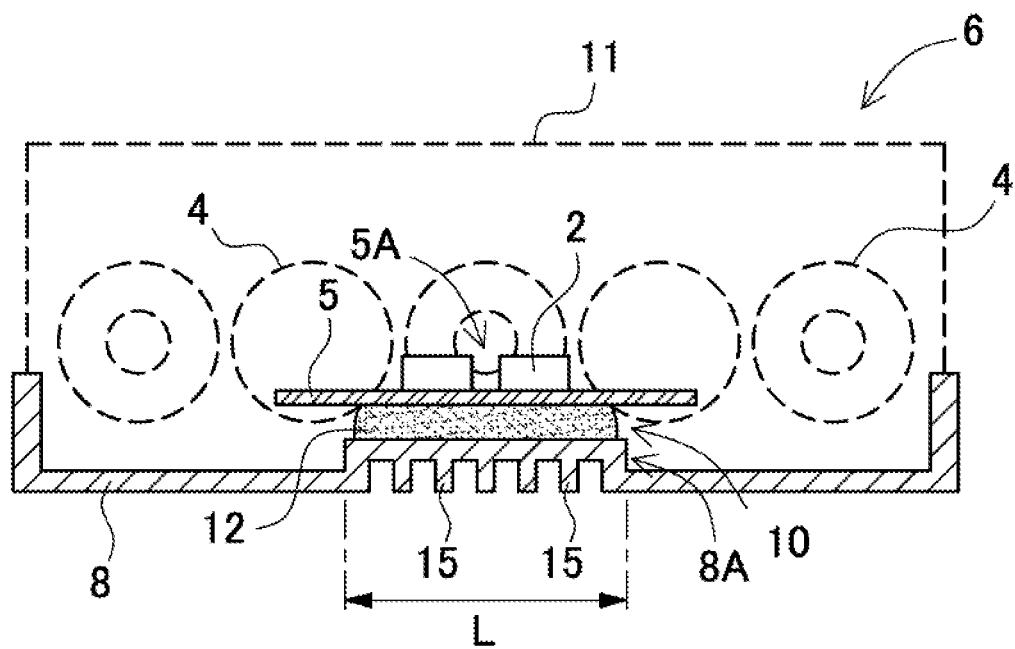
FIG. 2 is a schematic cross-sectional view of the electrical equipment battery according to an exemplary embodiment of the present invention.

As illustrated in FIGS. 2 and 7, metal case 8 is provided with heat radiation plate 8A protruding inwardly. In addition, flow-out block partitions 14 line up two parallel rows on both sides of heat transfer space 10 provided between heat radiation plate 8A and circuit board 5. Heat transfer space 10, which is provided with flow-out block partitions 14 on both sides, has an elongated shape with length (L longer than width (W). When the viscosity is lowered, electrical-insulating and heat-conducting gel 12 tends to move and flow out along the width, which is smaller than the length. Flow block groove 13 having length (L) larger than width (W) blocks electrical-insulating and heat-conducting gel 12 from moving and flowing out along the width by using flow-out block partitions 14 on both sides. As a result, heat transfer space 10 that is provided with flow-out block partitions 14 on both sides blocks electrical-insulating and heat-conducting gel 12 from moving along the width so that electrical-insulating and heat-conducting gel 12 is less likely to flow out. In short, this structure is effective in suppressing electrical-insulating and heat-conducting gel 12 from flowing out even when the viscosity of electrical-insulating and heat-conducting gel 12 is lowered. With the structure in which the flow-out block partitions are provided on both sides of the heat transfer space but not provided on both edges, excessive amount of the electrical-insulating and heat-conducting gel can be discharged from both edges on which no flow-out block partitions are provided, during an assembly process. In short, this structure facilitates positioning of the circuit board in place. In the assembling process, the electrical-insulating and heat-conducting gel is filled in the heat transfer space by a volume greater than the volume of the heat transfer space. Then, the circuit board is positioned in place while pressed against the electrical-insulating and heat-conducting gel. In this state, the electrical-insulating and heat-conducting gel is brought into close contact with both surfaces of the circuit board and the heat radiation plate. The excessive amount of the electrical-insulating and heat-conducting gel can be thereby discharged smoothly from both edges of the heat transfer space on which no flow-out block partitions are provided.

Although not illustrated, the heat radiation plate may also be provided with flow-out block partitions on both edges of the heat transfer space along its long side. By providing the flow-out block partition around the heat transfer space, the electrical-insulating and heat-conducting gel can be more reliably suppressed from flowing out. The structure in which the flow-out block partition is provided around the heat transfer space and flow block gap (S), which is smaller than clearance (d) of the heat transfer space, reliably blocks the electrical-insulating and heat-conducting gel from flowing out when the viscosity is lowered. This structure thus can reliably suppress the electrical-insulating and heat-conducting gel from flowing out due to long-time vibration.

Metal case 8 is provided with heat radiation fins 15 on the outer surface of heat radiation plate 8A that protrudes inwardly. Heat radiation fins 15 are provided on entire heat radiation plate 8A. When heat energy is transmitted from circuit board 5 to heat radiation fins 15 via electrical-insulating and heat-conducting gel 12, radiation fins 15 efficiently radiate this heat energy to the outside of outer case 6. As illustrated in the cross-sectional view of FIG. 6, heat radiation plate 8A protrudes inwardly from metal case 8, and ends of heat radiation fins 15 are flush with the bottom surface of metal case 8 surrounding heat radiation plate 8A. This structure can radiate heat efficiently from heat radiation plate 8A to the outside without protruding heat radiation plate 8A from the bottom surface of outer case 6.

INDUSTRIAL APPLICABILITY

Electrical equipment battery for vehicles of the present invention can be effectively used for electric-powered vehicles, vehicles having an idling stop function, and other vehicles and is effective in stably supplying electric power to electric devices to keep the vehicles in a traveling state.

The invention claimed is:
1. An electrical equipment battery for vehicles comprising:
   a secondary battery;
   a circuit board mounted with a protection circuit for the secondary battery and a heat generating element that is disposed upon a heat generating element mounting part of the circuit board; and
   an outer case that accommodates the circuit board and the secondary battery,
   wherein the outer case has a heat radiation plate made of metal, the heat radiation plate being provided with a heat transfer space defined between the heat radiation plate and the heat generating element mounting part of the circuit board,
   an electrical-insulating and heat-conducting gel, having viscosity that is lowered by stress, is filled in the heat transfer space, wherein heat is transferred from the heat generating element mounting part to the heat radiation plate via the electrical-insulating and heat-conducting gel, and the heat radiation plate has a flow-out block partition on an outer side of the heat transfer space, the flow-out block partition configured to suppress the electrical-insulating and heat-conducting gel filled in the heat transfer space from flowing out from the heat transfer space, wherein electronic components including the heat generating element are mounted on a front surface of the circuit board, and a rear surface of the circuit board is thermally coupled to the heat radiation plate via the electrical-insulating and heat-conducting gel, and wherein a pair of the flow-out block partitions are provided on both sides along a length of the heat transfer space but not provided on both edges along a width, less than the length, of the heat transfer space.

2. The electrical equipment battery for vehicles according to claim 1, wherein a gap of the heat transfer space is set to less than or equal to 3 mm.

3. The electrical equipment battery for vehicles according to claim 1, wherein the flow-out block partition has a projection surface, at least a portion of the projection surface being positioned opposite a surface on the front surface of the circuit board in which the heat generating element is mounted on the circuit board, a flow-out block gap (S) is defined between the circuit board and the portion of the projection surface positioned opposite the circuit board, and the flow-out block gap (S) is set to be smaller than a clearance (d) of the heat transfer space.

4. The electrical equipment battery for vehicles according to claim 1, wherein a heat radiation fin is provided on an outer side of the heat radiation plate.

5. The electrical equipment battery for vehicles according to claim 1, wherein the outer case includes a metal case and a plastic case, the metal case including the heat radiation plate and the plastic case covering an opening of the metal case.

6. The electrical equipment battery for vehicles according to claim 1, wherein the heat generating element is a semiconductor switching element that connects the secondary battery to a lead battery mounted in a vehicle.

* * * * *